(12) United States Patent
Liu et al.

(10) Patent No.: US 11,930,635 B2
(45) Date of Patent: Mar. 12, 2024

(54) SEMICONDUCTOR STRUCTURE AND METHOD OF MANUFACTURING SAME

(71) Applicant: CHANGXIN MEMORY TECHNOLOGIES, INC., Hefei (CN)

(72) Inventors: Zhongming Liu, Hefei (CN); Jia Fang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 149 days.

(21) Appl. No.: 17/399,062

(22) Filed: Aug. 11, 2021

(65) Prior Publication Data
US 2022/0020751 A1  Jan. 20, 2022

Related U.S. Application Data

(63) Continuation of application No. PCT/CN2021/100787, filed on Jun. 18, 2021.

(30) Foreign Application Priority Data

Jul. 16, 2020  (CN) .......................... 202010684751.5

(51) Int. Cl.
  H01L 27/108  (2006.01)
  H10B 12/00  (2023.01)
(52) U.S. Cl.
  CPC ......... H10B 12/485 (2023.02); H10B 12/482 (2023.02)
(58) Field of Classification Search
  CPC .... H10B 12/485; H10B 12/482; H10B 12/00; H10B 12/0335; H10B 12/30
  See application file for complete search history.

(56) References Cited

U.S. PATENT DOCUMENTS

| 10,475,794 B1 | 11/2019 | Wu et al. |
| 2012/0012911 A1 | 1/2012 | Jeong |

(Continued)

FOREIGN PATENT DOCUMENTS

| CN | 102339829 A | 2/2012 |
| CN | 108257958 A | 7/2018 |
| CN | 110690193 A | 1/2020 |

OTHER PUBLICATIONS

European Patent Office, Extended European Search Report Issued in Application No. 21843091.6, dated Nov. 7, 2023 Germany, 9 pages.

*Primary Examiner* — Mohammed R Alam
(74) *Attorney, Agent, or Firm* — Kilpatrick Townsend & Stockton LLP

(57) ABSTRACT

The present application relates to a semiconductor structure and a method of manufacturing the same. The method includes: providing a substrate; forming a bitline contact hole located in the substrate, and a non-metal conductive layer with which a surface of the substrate is covered and the bitline contact hole is filled, the non-metal conductive layer provided with a first opening therein, the first opening aligned with the bitline contact hole; forming a metal conductive layer, with which a surface of the non-metal conductive layer is covered; forming an insulation layer, with which a surface of the metal conductive layer surface is covered; and etching the insulation layer, the metal conductive layer, and the non-metal conductive layer to form a bitline structure.

11 Claims, 6 Drawing Sheets

(56) References Cited

U.S. PATENT DOCUMENTS

| | | | |
|---|---|---|---|
| 2014/0030884 A1* | 1/2014 | Rouh | H01L 21/32139 |
| | | | 438/653 |
| 2015/0364334 A1 | 12/2015 | Kang et al. | |
| 2016/0163637 A1 | 6/2016 | Jung et al. | |
| 2020/0144273 A1* | 5/2020 | Huang | H10B 12/0335 |
| 2021/0035613 A1* | 2/2021 | Park | H10B 12/485 |

* cited by examiner

SEMICONDUCTOR STRUCTURE AND METHOD OF MANUFACTURING SAME

CROSS REFERENCE TO RELATED APPLICATION

The present application is a continuation of PCT/CN2021/100787, filed on Jun. 18, 2021, which claims priority to Chinese Patent Application No. 2020106847515, entitled "SEMICONDUCTOR STRUCTURE AND METHOD OF MANUFACTURING SAME" and filed to the Patent Office of the People's Republic of China on Jul. 16, 2020, the entire contents of which are incorporated herein by reference.

FILED OF THE INVENTION

The present application relates to the field of semiconductor manufacturing technologies, in particular to a semiconductor structure and a method of manufacturing the same.

BACKGROUND OF THE INVENTION

In a semiconductor structure, a bitline structure is of a laminated construction of a cap layer (an insulation layer), a metal conductive layer, and a non-metal conductive layer disposed from top to bottom as a stack, wherein the metal conductive layer and the non-metal conductive layer form a bitline of the bitline structure. In order to mitigate a phenomenon of electric leakage between the bitlines, the bitline in a current semiconductor structure has a small width in a bitline contact hole, and the reduction in width causes an increased contact resistance between the bitline and an active region (i.e., a bitline contact resistance); besides, the bitline has a great width on a surface of a substrate and thus, occupies partial space of a node contact window and causes an increased contact resistance between the node contact window and the active region (i.e., a node contact resistance), thereby affecting the quality of the semiconductor structure.

SUMMARY OF THE INVENTION

A semiconductor structure and a method of manufacturing the same are provided according to various embodiments of the present application.

An embodiment of the present application provides a method of manufacturing a semiconductor structure. The method includes the following steps:
  providing a substrate;
  forming a bitline contact hole located in the substrate, and a non-metal conductive layer with which a surface of the substrate is covered and the bitline contact hole is filled, the non-metal conductive layer provided with a first opening therein, the first opening aligned with the bitline contact hole;
  forming a metal conductive layer, with which a surface of the non-metal conductive layer is covered;
  forming an insulation layer, with which a surface of the metal conductive layer is covered;
  and
  etching the insulation layer, the metal conductive layer, and the non-metal conductive layer to form a bitline structure;
  wherein the metal conductive layer and the non-metal conductive layer collectively form a bitline, and the bitline located in the bitline contact hole has a width no less than the bitline located outside of the bitline contact hole.

In one of the embodiments, in the bitline structure, the bitline located in the bitline contact hole has a width greater than the bitline outside of the bitline contact hole.

In one of the embodiments, the step of forming the bitline contact hole and the non-metal conductive layer includes:
  forming a first sublayer of non-metal conductive material on the substrate;
  etching the first sublayer of non-metal conductive material and the substrate to form the bitline contact hole, the retained first sublayer of non-metal conductive material serving as a first sublayer of the non-metal conductive layer;
  forming a second sublayer of the non-metal conductive layer, with which the bitline contact hole is filled and a top of which is lower than a top of the first sublayer of the non-metal conductive layer, the first and second sub-layers of the non-metal conductive layer collectively forming the non-metal conductive layer.

In one of the embodiments, the step of etching the first sublayer of non-metal conductive material and the substrate to form the bitline contact hole includes:
  forming a first hard mask layer on the first sublayer of non-metal conductive material, the first hard mask layer having a first graphical target pattern, the first graphical target pattern defining the bitline contact hole; and
  etching, based on the first hard mask layer, the first sublayer of non-metal conductive material and the substrate to form the bitline contact hole.

In one of the embodiments, the step of forming the second sublayer of the non-metal conductive layer includes:
  forming a second sublayer of non-metal conductive material, with which the bitline contact hole is filled and a surface of the first hard mask layer is covered; and
  etching the second sublayer of non-metal conductive material based on the first hard mask layer until a height difference between a top of the first sublayer of non-metal conductive material and a top of the second sublayer of non-metal conductive material equals to a preset value, the retained second sublayer of non-metal conductive material serving as the second sublayer of the non-metal conductive layer.

In one of the embodiments, the metal conductive layer is formed using an atomic layer deposition technology.

In one of the embodiments, the steps of forming the metal conductive layer include:
  forming a metal barrier material layer, with which the surface of the non-metal conductive layer is covered; and
  forming a metal material layer, with which a surface of the metal barrier material layer is covered.

In one of the embodiments, the step of etching the insulation layer, the metal conductive layer, and the non-metal conductive layer to form a bitline structure includes:
  forming a second hard mask layer on the insulation layer, the second hard mask layer having a second graphical target pattern, the second graphical target pattern defining the bitline structure;
  with the metal conductive layer serving as an etching stop layer, using the second hard mask layer as a mask to etch the insulation layer to transfer the second graphical target pattern to the insulation layer;
  removing the second hard mask layer; and
  with the insulation layer serving as a mask, etching the metal conductive layer and the non-metal conductive layer to form the bitline structure.

In one of the embodiments, the step of etching the metal conductive layer and the non-metal conductive layer with the insulation layer serving as the mask includes:

with the metal barrier material layer serving as an etching stop layer, using the insulation layer as a mask to etch metal material to transfer the second graphical target pattern to the metal conductive layer;

with the non-metal conductive layer serving as an etch stop layer, using the insulation layer as the mask to etch the metal barrier material layer to transfer the second graphical target pattern to the metal barrier material layer; and using the insulation layer as the mask to etch the non-metal conductive layer to transfer the second graphical target pattern to the non-metal conductive layer.

In one of the embodiments, a non-metal conductive material layer is produced by using polycrystalline silicon material.

In one of the embodiments, the non-metal conductive layer is etched by using an etching gas containing Cl2.

In one of the embodiments, a dielectric layer, with which the surface of the substrate is covered, is formed prior to forming the bitline contact hole and the non-metal conductive layer.

An embodiment of the present application also provides a semiconductor structure, including:

a substrate with a plurality of bitline contact holes; and a bitline structure including a non-metal conductive layer, a metal conductive layer, and an insulation layer disposed from bottom to top as a stack, wherein the non-metal conductive layer is sequentially and alternately located on a surface of the semiconductor substrate and a bottom of the bitline contact hole;

wherein the metal conductive layer and the non-metal conductive layer collectively form a bitline, and the bitline located in the bitline contact hole has a width no less than the bitline located outside of the bitline contact hole.

In one of the embodiments, in the bitline structure, the bitline located in the bitline contact hole has a width greater than the bitline outside of the bitline contact hole.

In one of the embodiments, the semiconductor structure further includes a dielectric layer located between the surface of the substrate and the non-metal conductive layer.

A semiconductor structure and a method of manufacturing the same are provided according to embodiments of the present application. The manufacturing method includes: providing a substrate; forming a bitline contact hole located in the substrate, and a non-metal conductive layer with which a surface of the substrate is covered and the bitline contact hole is filled, the non-metal conductive layer provided with a first opening therein, the first opening aligned with the bitline contact hole; forming a metal conductive layer, with which a surface of the non-metal conductive layer is covered; forming an insulation layer, with which a surface of the metal conductive layer surface is covered; and etching the insulation layer, the metal conductive layer, and the non-metal conductive layer to form a bitline structure. In the present application, with formation of a non-metal conductive layer having a first opening, a duration of etching a metal conductive layer located outside of a bitline contact hole is increased in the course of forming a bitline structure by an etching process, such that the metal conductive layer located outside of the bitline contact hole has a width less than or equal to a bottom of the metal conductive layer located in the bitline contact hole, so as to increase the area of a node contact window and a bitline separately contacting an active region, reduce a node contact resistance and a bitline contact resistance, and improve a quality of the semiconductor structure.

BRIEF DESCRIPTION OF THE DRAWINGS

In order to more clearly illustrate the embodiments of the present application or the technical solutions of the traditional technology, the accompanying drawings required to be used in the description of the embodiments or traditional techniques will be briefly introduced below. Apparently, the accompanying drawings in the following description show merely some embodiments of the present application, and persons of ordinary skill in the art may still derive other drawings from these accompanying drawings without creative efforts.

Figure 1:
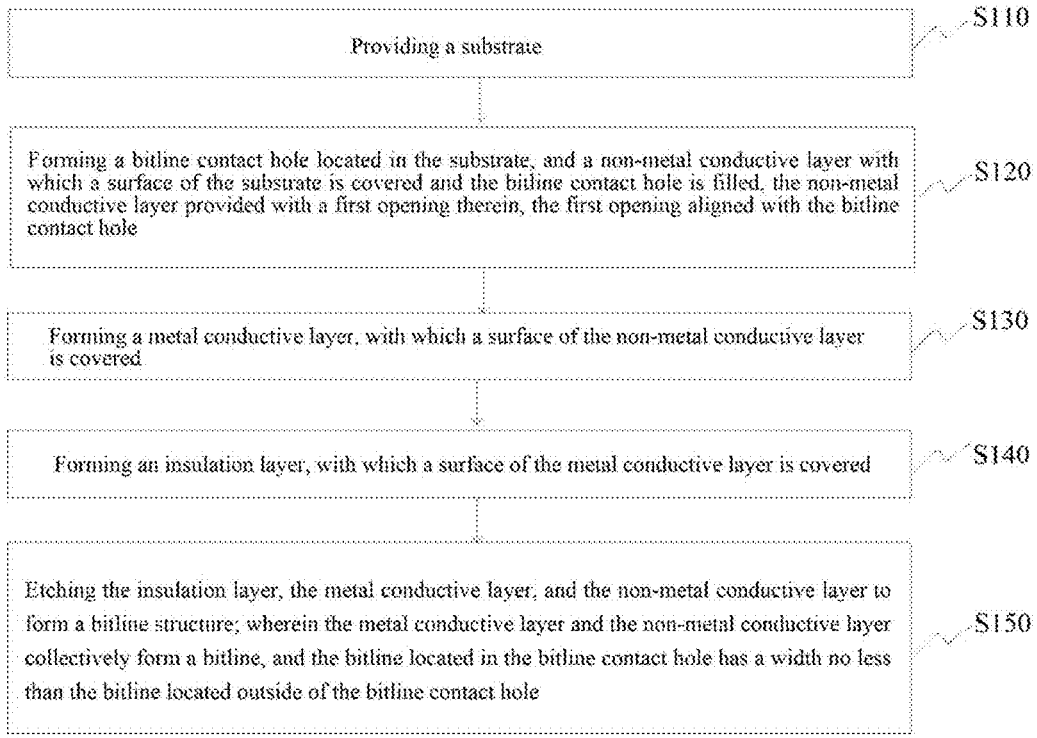
FIG. 1 is a flowchart of a method of manufacturing a semiconductor structure according to an embodiment of the present application.

Reference numerals: substrate—100, bitline contact hole—200, non-metal conductive layer—300, second sublayer of non-metal conductive material—320a, second sublayer of the non-metal conductive layer—320, first sublayer of non-metal conductive material—310a, first sublayer of the non-metal conductive layer—310, metal conductive layer—400, metal barrier material layer—410, metal material layer—420, insulation layer—500, dielectric layer—600, first hard mask layer—700, first hard mask material layer—710, first organic mask material layer—720, second hard mask layer—800, second organic mask material layer—810, second hard mask material layer—820, third hard mask material layer—830, first opening—K1, second opening—K2, bitline structure—900.

DETAILED DESCRIPTION OF THE EMBODIMENTS

The detailed description of the present application is given below in combination with drawings for the purpose of making the above objectives, features, and advantages of the present application more obvious and understandable. Many details are elaborated in the description below so as to fully comprehend the present application. However, the present application may be implemented in a number of other ways which are different from those described herein. The person skilled in the art can make similar improvements without departing from the connotation of the present application. Therefore, the present application is not limited to the specific implementations disclosed below.

Referring to FIG. 1, a method of manufacturing a semiconductor structure according to an embodiment of the present application is provided. The method includes the following steps:

Step S110: providing a substrate 100;

Step S120: forming a bitline contact hole 200 located in the substrate 100, and a non-metal conductive layer 300 with which a surface of the substrate 100 is covered and the bitline contact hole 200 is filled, the non-metal conductive layer 300 provided with a first opening K1 therein, the first opening K1 aligned with the bitline contact hole 200;

Step S130: forming a metal conductive layer 400, with which a surface of the non-metal conductive layer 300 is covered;

Step S140: forming an insulation layer 500, with which a surface of the metal conductive layer 400 is covered; and Step S150: etching the insulation layer 500, the metal conductive layer 400, and the non-metal conductive layer 300 to form a bitline structure 900; wherein the metal conductive layer and the non-metal conductive layer collectively form a bitline, and the bitline located in the bitline contact hole has a width no less than the bitline located outside of the bitline contact hole.

It can be understood that in the present application, with formation of the non-metal conductive layer 300 having the first opening K1, a duration of etching the metal conductive layer 400 located outside of the bitline contact hole 200 is increased in the course of forming the bitline structure 900 by an etching process, such that the metal conductive layer 400 located outside of the bitline contact hole 200 has a width less than or equal to a bottom of the metal conductive layer 400 located in the bitline contact hole 200, so as to increase the area of a node contact window and a bitline separately contacting an active region, reduce a node contact resistance and a bitline contact resistance, and improve a quality of the semiconductor structure.

In this embodiment, the substrate 100 includes a silicon substrate, an epitaxial silicon substrate, a silicon-germanium substrate, a silicon carbide substrate or a silicon-coated insulation substrate, but not limited thereto. The person skilled in the art may select a type of the substrate 100 based on the semiconductor structure formed on the substrate 100. Therefore, the type of the substrate 100 should not limit the protection scope of the present application. In this embodiment, the substrate 100 is a P-type crystalline silicon substrate 100.

The substrate 100 includes a base and a shallow trench structure formed in the base. The shallow trench structure defines a plurality of active regions in a parallel staggered arrangement, and is filled with insulation material to form a shallow trench isolation structure. The substrate 100 also includes a wordline structure, which is an embedded wordline structure; an extending direction of the embedded wordline structure intersects with an extending direction of the bitline structure 900. In addition, the wordline structure may also be formed on the surface of the base.

In one of the embodiments, in the bitline structure 900, the bitline located in the bitline contact hole 200 has a width greater than the bitline outside of the bitline contact hole 200.

The width of the bitline is a width of a projection of the bitline along a direction perpendicular to the substrate. In this embodiment, the bottom of the metal conductive layer 400 located in the bitline contact hole 200 has a width of d1, the metal conductive layer 400 located outside of the bitline contact hole 200 has a width of d2, wherein d1>d2. In the case where the width of d1 has a greater value, a width of the non-metal conductive layer 300 located below is increased therewith; thus, an overall width of the bitline located in the bitline contact hole 200 is increased (including the metal conductive layer and the non-metal conductive layer), and the contact area between the non-metal conductive layer and the active region is increased and thus, the contact resistance between them is decreased. Besides, by thinning the metal conductive layer 400 located outside of the bitline contact hole 200, the width of the non-metal conductive layer 300 located below is reduced, the contact area between the node contact window and the active region is increased, and the contact resistance between the contact window and the active region is decreased.

In one of the embodiments, the method of manufacturing the semiconductor structure further includes:

a dielectric layer 600, with which the surface of the substrate 100 is covered, is formed prior to forming the bitline contact hole 200 and the non-metal conductive layer 300.

Figure 2:
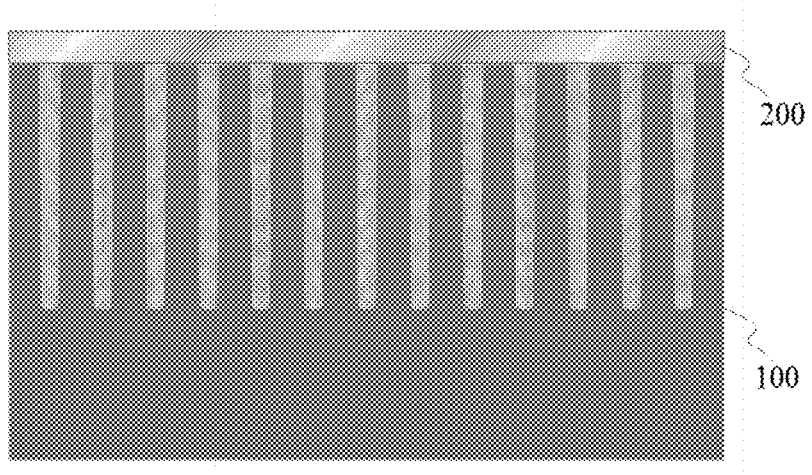
FIG. 2 to FIG. 12 each is a structural schematic diagram of a semiconductor structure subjected to each of etching steps according to an embodiment of the present application.

Referring to FIG. 2, dielectric material is deposited on the surface of the substrate 100 by a deposition process, so as to form the dielectric layer 600, with which the surface of the substrate 100 is covered. The dielectric material may include any one or combination of silicon oxide, silicon oxynitride, amorphous silicon, amorphous carbon or other dielectric material. The deposition process may include chemical vapor deposition (CVD), low pressure CVD (LPCVD), plasma enhanced CVD (PECVD), an atomic layer deposition (ALD), and plasma enhanced ALD (PEALD).

After the dielectric layer 600 is formed, a next step is generally to manufacture the bitline contact hole 200, while the step of forming the bitline contact hole and the step of manufacturing the non-metal conductive layer are combined in the present application for the purposes of saving a manufacturing cost and simplifying a manufacturing process. In one of the embodiments, the step of forming the bitline contact hole 200 and the non-metal conductive layer 300 includes:

forming a first sublayer of non-metal conductive material 310a on the substrate 100;

etching the first sublayer of non-metal conductive material 310a and the substrate 100 to form the bitline contact hole 200, the retained first sublayer of non-metal conductive material 310a serving as a first sublayer 310 of the non-metal conductive layer; and forming a second sublayer 320 of the non-metal conductive layer, with which the bitline contact hole 200 is filled and a top of which is lower than a top of the first sublayer 310 of the non-metal conductive layer, the first and second sublayers 310, 320 of the non-metal conductive layer collectively forming the non-metal conductive layer 300.

Figure 3:
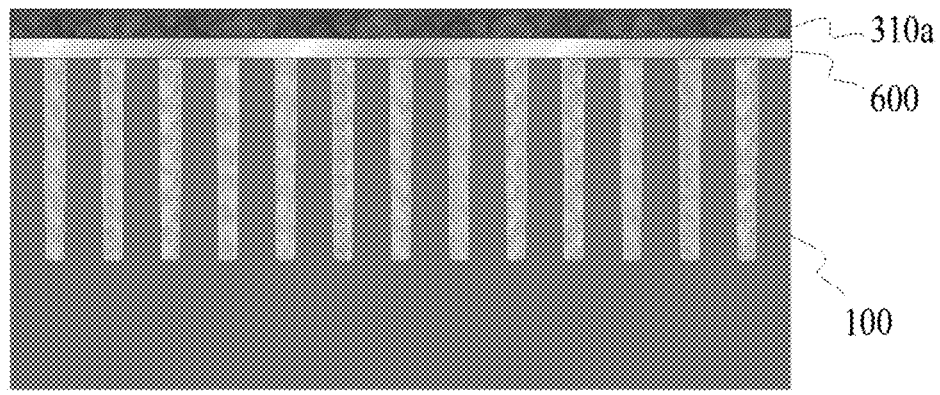

Referring to FIG. 3, the procedure of forming the bitline contact hole 200 and the non-metal conductive layer 300 according to this embodiment includes the following steps.

Step 1: non-metal conductive material, such as polycrystalline silicon, noncrystalline silicon or other non-metal conductive materials with or without silicon, is deposited by the deposition process to form a first sublayer of non-metal conductive material 300a; referring to FIG. 3, the surface of the substrate 100 is entirely covered by the first sublayer of non-metal conductive material 310a.

Figure 4:
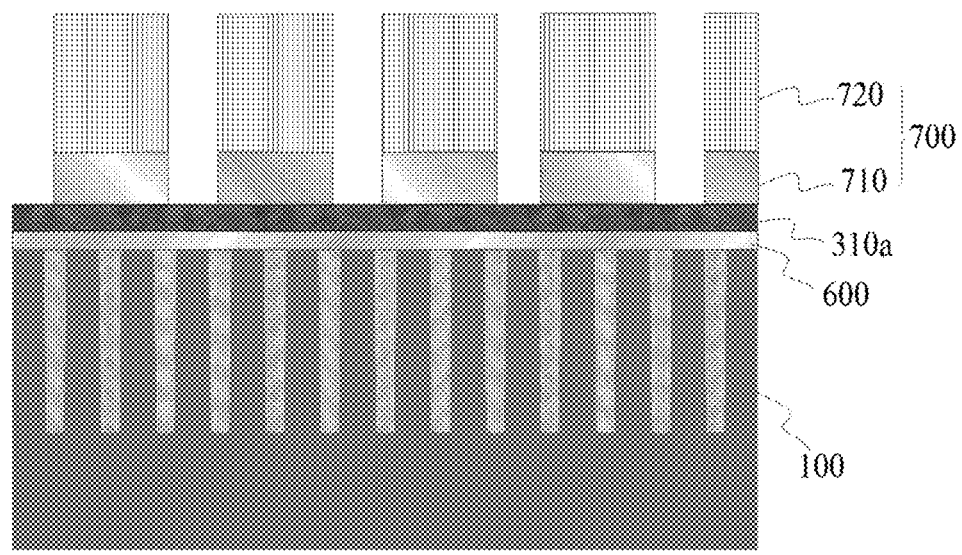
Figure 5:
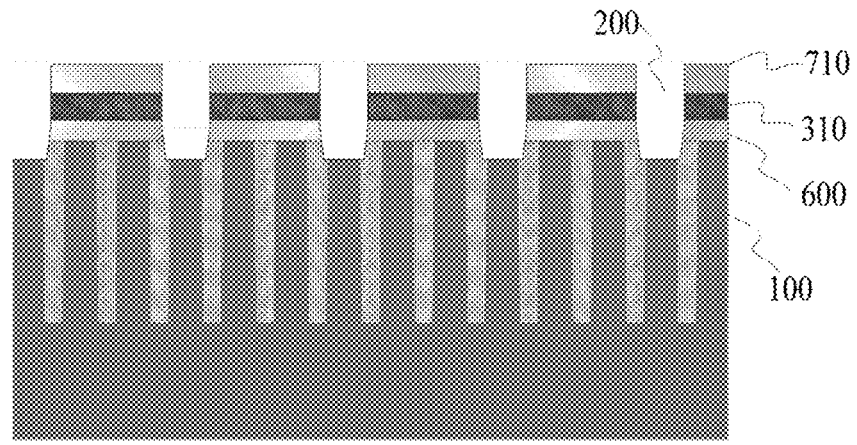

Step 2: etching the first sublayer of non-metal conductive material 310a and the substrate 100 to form the bitline contact hole 200, the retained first sublayer of non-metal conductive material 310a serving as a first sublayer 310 of the non-metal conductive layer. Referring to FIGS. 4 and 5, in one of the embodiments, the step of etching the first sublayer of non-metal conductive material 310a and the substrate 100 to form the bitline contact hole 200 includes: forming a first hard mask layer on the first sublayer of non-metal conductive material 310a, the first hard mask layer having a first graphical target pattern, the first graphical target pattern defining the bitline contact hole 200; etching, based on the first hard mask layer, the first sublayer of non-metal conductive material 310a and the substrate 100 to form the bitline contact hole 200.

In this embodiment, the procedure of forming the first hard mask layer 700 includes: sequentially forming a first hard mask material layer 710 and a first organic mask material layer 720 on a surface of the first sublayer of non-metal conductive material 310a, wherein the first hard mask material layer 710 is formed using silicon oxide or other insulation materials, the first organic mask material layer 720 is formed using organic materials containing silicon; forming the first hard mask layer 70 consisting of the first hard mask material layer 710 and the first organic mask material layer 720; then, coating a layer of photoresist on the first organic mask material layer 720 to form a first photoresist layer (not shown), and patterning the first photoresist layer by a photolithography process, the patterned first photoresist layer having a first graphical target pattern defining the bitline structure 900; finally, with the first photoresist layer serving as a mask, etching the first hard mask material layer 710 and the first organic mask material layer 720 to transfer the first graphical target pattern to the first hard mask layer 700. In addition, after the bitline structure 900 is formed, removing the first organic mask material layer 720 and the first photoresist layer, and retaining only the first hard mask material layer as the first hard mask layer.

Step 3: forming the second sublayer 320 of the non-metal conductive layer. In one of the embodiments, the step of forming the second sublayer 320 of the non-metal conductive layer includes:

forming a second sublayer of non-metal conductive material 320a, with which the bitline contact hole 200 is filled and the surface of the first hard mask layer 700 is covered;

etching the second sublayer of non-metal conductive material 320a based on the first hard mask layer 700 until a top of the first sublayer of non-metal conductive material 310a is higher than a top of the second sublayer of non-metal conductive material 320a, and a height difference between the top of the first sublayer of non-metal conductive material 310a and the top of the second sublayer of non-metal conductive material 320a equals to a preset value, the retained second sublayer of non-metal conductive material 320a serving as the second sublayer 320 of the non-metal conductive layer.

In this embodiment, the procedure of forming the second sublayer 320 of the non-metal conductive layer is as follows.

Figure 6:
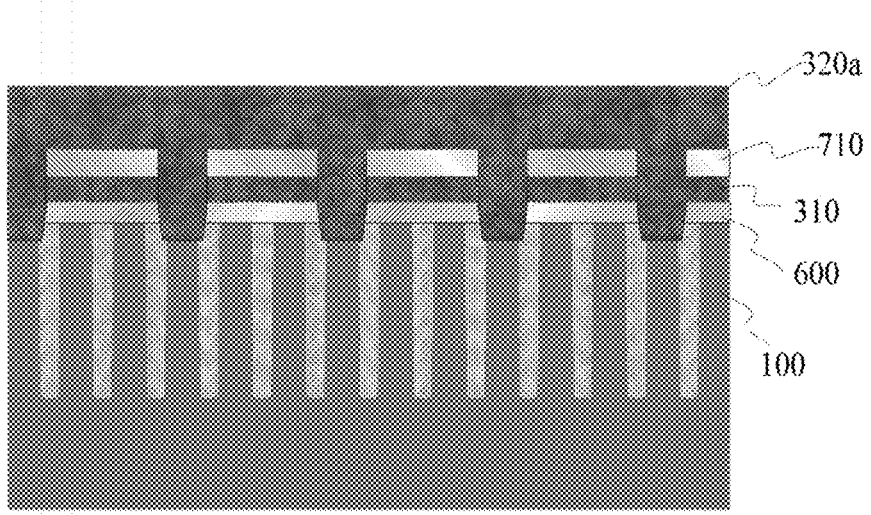

1) Firstly, referring to FIG. 6, non-metal conductive material, such as polycrystalline silicon, noncrystalline silicon or other non-metal conductive materials with or without silicon, is deposited by the deposition process to form the first sublayer of non-metal conductive material 320a, with which the surface of the first hard mask material layer 710 is entirely covered and the bitline contact hole 200 is filled. In this embodiment, both of the first sublayer of non-metal conductive material 310a and the second sublayer of non-metal conductive material 320a are made of polycrystalline silicon material for ease of material management and reduction in manufacturing cost.

Figure 7:
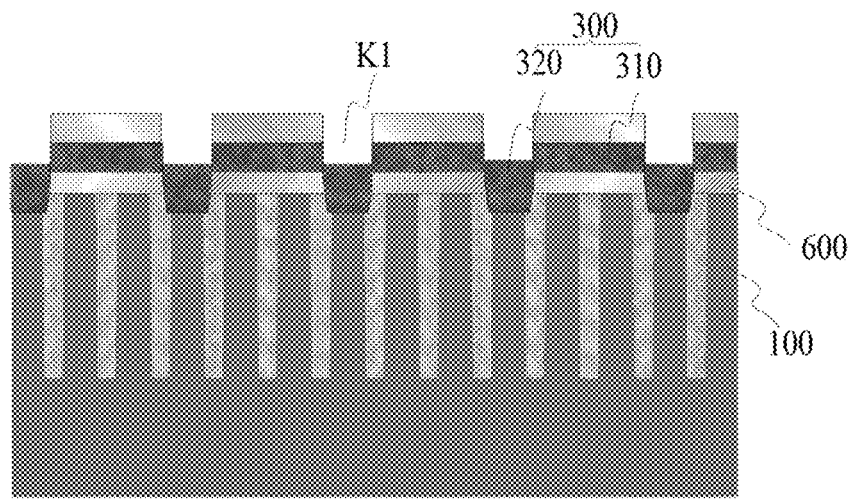

2) Secondly, referring to FIG. 7, etching the second sublayer of non-metal conductive material 320a based on the first hard mask material layer 710 until the second sublayer of non-metal conductive material 320a located on an upper surface of the first hard mask material layer 710 is completely removed, a top of the first sublayer of non-metal conductive material 310a is higher than a top of the second sublayer of non-metal conductive material 320a, and a height difference between the top of the first sublayer of non-metal conductive material 310a and the top of the second sublayer of non-metal material 320a equals to a preset value, the retained second sublayer of non-metal conductive material 320a serving as the second sublayer 320 of the non-metal conductive layer. The first and second sub-layers 310, 320 of the non-metal conductive layer form the first opening K1 having a height equal to a preset value, and the first opening K1 is aligned with the bitline contact hole 200. Moreover, since the same hard mask layer is used, namely using the first hard mask material layer 710 as a mask for the etching process, so as to form the bitline contact hole 200 and the second sublayer of non-metal conductive material 320a, in this embodiment, the first opening K1 has a width equal to the bitline contact hole. And, the procedure of forming the bitline contact hole 200 is combined with the procedure of forming the non-metal conductive layer 300, and the same hard mask layer is used as the mask for the etch, which are beneficial to simplify the processes and reduce the manufacturing cost. In some of other embodiments, the bitline contact hole 200 and the non-metal conductive layer 300 may also be formed step by step. For example, the bitline contact hole is formed first, and then the noncrystalline silicon material layer, with which the bitline contact hole is filled and the surface of the substrate is covered, is formed and back-etched to form the first opening K1.

Figure 8:
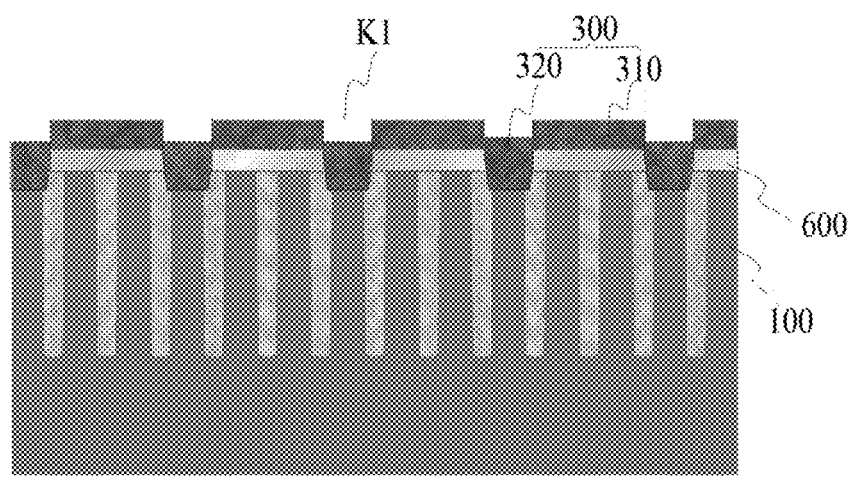

Step 4: removing the first hard mask material layer 710 by a chemical-mechanical polishing process; please refer to FIG. 8.

In some of other embodiments, the second sublayer 320 of the non-metal conductive layer may also be formed using non-metal conductive materials with different etching ratios, the procedure of which includes the following steps.

Step 1: first removing the first hard mask material layer 710 by the chemical-mechanical polishing process.

Step 2: depositing non-metal conductive material to form the second sublayer of non-metal conductive material 320a, with which the first sublayer 310 of the non-metal conductive layer is covered and the bitline contact hole 200 is filled. Besides, the first sublayer of non-metal conductive material 310a is of different material from the second sublayer of non-metal conductive material 320a. For example, the first sublayer of non-metal conductive material 320a is made of polycrystalline silicon, and the second sublayer of non-metal conductive material 320a is made of semiconductor oxide, wherein the semiconductor oxide has an etching rate greater than the polycrystalline silicon (e.g., under a certain etching condition, a ratio of the etching rate of the semiconductor oxide to the etching rate of the polycrystalline silicon is greater than 10).

Step 3: etching the first sublayer of non-metal conductive material 310a and the second sublayer of non-metal conductive material 320a based on their etching ratio, until the top of the first sublayer of non-metal conductive material 310a is higher than the top of the second sublayer of non-metal conductive material 320a, and a height difference between the top of the first sublayer of non-metal conductive material 310a and the top of the second sublayer of non-metal conductive material 320a equals to a preset value to form the first opening K1.

Figure 9:
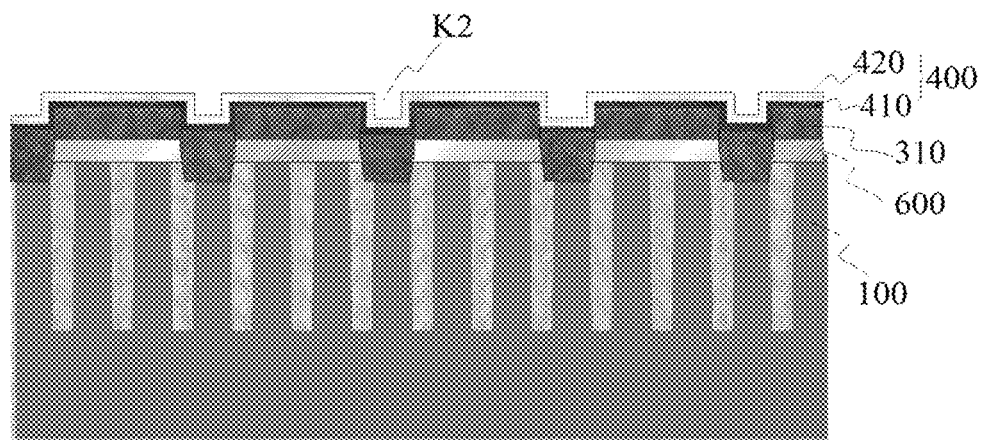

Referring to FIG. 9, after the bitline contact hole and the non-metal conductive layer are formed, the metal conductive layer is required to be manufactured in a next step. In one of the embodiments, the steps of forming the metal conductive layer 400 include:

forming a metal barrier material layer 410, with which the surface of the non-metal conductive layer 300 is covered; and forming a metal material layer 420, with which a surface of the metal barrier material layer 410 is covered.

In this embodiment, the metal conductive layer 400 is of a laminated construction, including the metal barrier material layer 410 and the metal material layer 420 disposed sequentially from bottom to top. The metal barrier material layer 410 and the metal material layer 420 may be formed by a stack of any one or combination of titanium nitride, titanium, tungsten silicide or a tungsten nitride and tungsten; wherein the metal barrier material layer 410 is formed using any one or combination of titanium nitride, titanium, tungsten silicide, tungsten nitride or tungsten silicon nitride. Besides, the metal conductive layer 400 may also be formed using other metals, metal nitride, metal silicide, and metal silicon nitride.

In one of the embodiments, the metal conductive layer 400 is formed by an atomic layer deposition technology. It can be understood that the atomic layer deposition technology is a method of plating a substance in a form of a single atom membrane layer by layer on a surface of the base. Compared with an ordinary chemical deposition technology, the metal conductive layer 400 formed by the atomic layer deposition technology has a highly uniform membrane thickness and a consistency on its surface, and can directly form the second opening K2 located above the first opening K1. In some of other embodiments, the metal material layer 420 may be first formed by other chemical deposition processes, and then etched by back-etching to form the metal conductive layer 400 having the second opening K2. Additionally, the second opening K2 may not be formed. In this embodiment, in the case where the atomic layer deposition technology is used to form the metal conductive layer, since the metal barrier material layer 410 and the metal material layer 420 are also formed on a side wall of the first opening K1, the second opening K2 has a width slightly less than the first opening K1.

In one of the embodiments, the procedure of forming the insulation layer 500, with which the surface of the metal conductive layer 400 is covered, mainly includes: depositing silicon nitride, silicon oxynitride, silicon carbide or other suitable insulation material to form the insulation layer 500, with which the surface of the metal material layer 420 is covered and the second opening K2 is filled. Moreover, in order to reduce a probability of electric leakage between the bitline and the capacitor contact line, a thickness of the insulation layer 500 is normally increased to mitigate such a phenomenon. Therefore, in this embodiment, the insulation layer 500 has a thickness much greater than the metal conductive layer 400 and/or the non-metal conductive layer 300.

In one of the embodiments, the step of etching the insulation layer 500, the metal conductive layer 400, and the non-metal conductive layer 300 to form the bitline structure 900 includes:

forming a second hard mask layer 800 on the insulation layer 500, the second hard mask layer 800 having a second graphical target pattern, the second graphical target pattern defining the bitline structure 900;

with the metal conductive layer 400 serving as an etch stop layer, using the second hard mask layer 800 as a mask to etch the insulation layer 500 to transfer the second graphical target pattern to the insulation layer 500;

removing the second hard mask layer 800; and with the insulation layer 500 serving as a mask, etching the metal conductive layer 400 and the non-metal conductive layer 300 to form the bitline structure 900.

In this embodiment, the main procedure of etching the insulation layer 500, the metal conductive layer 400, and the non-metal conductive layer 300 to form the bitline structure 900 is as follows.

Figure 10:
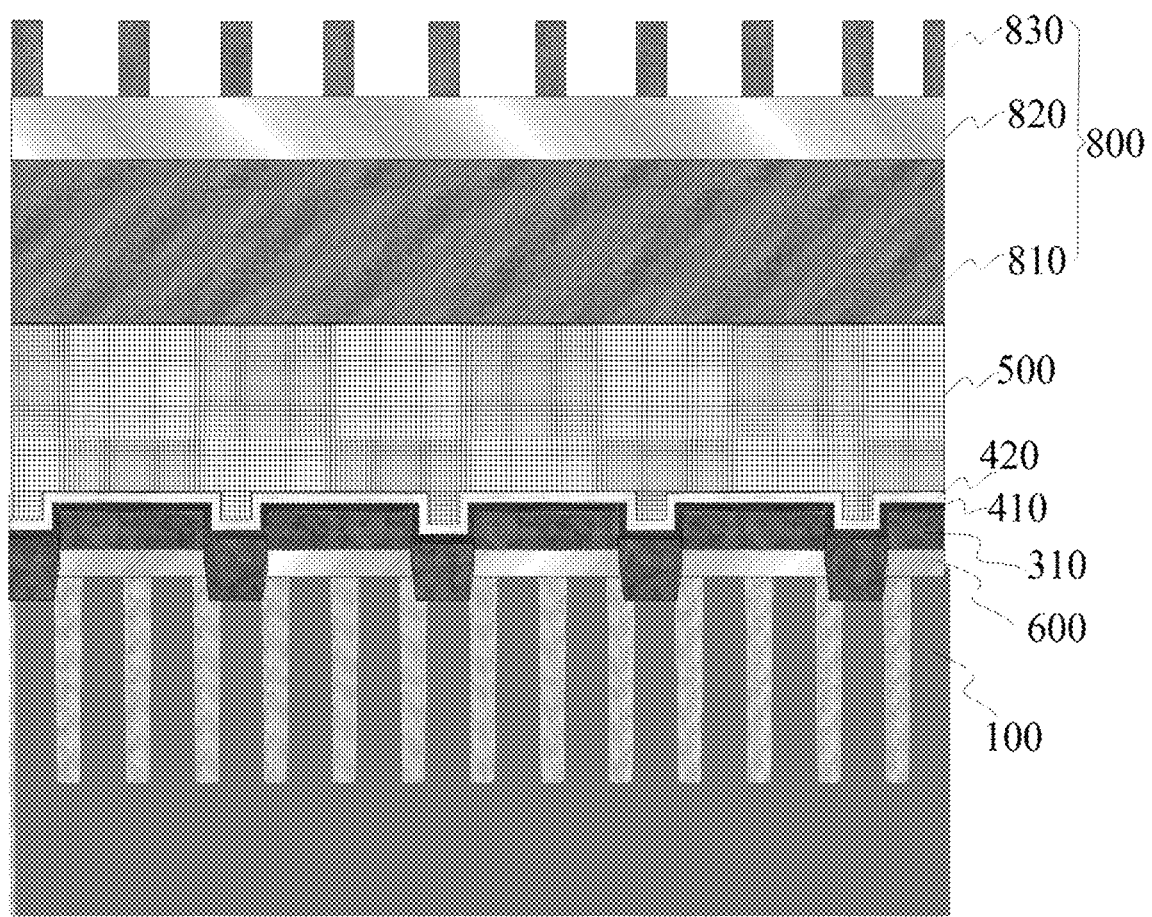

1) Referring to FIG. 10, the second hard mask layer 800 is formed. In this embodiment, the second hard mask layer 800 is formed by a self-aligning dual imaging technology. The forming procedure mainly includes: firstly, sequentially depositing an amorphous carbon material, a silicon oxynitride material, and an oxide material on the surface of the insulation layer 500 to form a second organic mask material layer 810, a second hard mask material layer 820, and a sacrificial material layer (not shown); coating a layer of photoresist on the sacrificial material layer to form a second photoresist layer, and transferring a pattern of a mask to the sacrificial material layer by using the photolithography technique. Secondly, the atomic layer deposition technology is used to deposit hard mask material on a surface of the sacrificial material layer to form a third hard mask material layer; back-etching the third hard mask material layer and retaining the third hard mask material layer 830 located on a side wall of the sacrificial material layer as the second graphical target pattern, so as to define the bitline structure 900. Then, the second graphical target pattern is sequentially transferred to the second hard mask material layer 820 and the second organic mask material layer 810. Finally, the third hard mask material layer 830 is removed to form the second hard mask layer 800 including the second hard mask material layer 820 and the second organic mask material layer 810.

Figure 11:
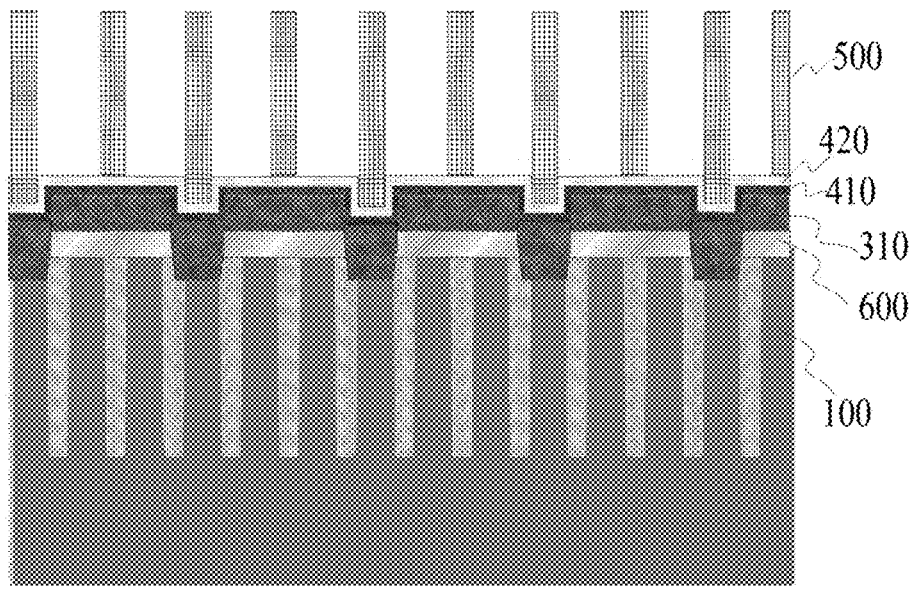

2) Referring to FIG. 11, with the metal conductive layer 400 serving as an etch stop layer, using the second hard mask layer 800 as a mask to etch the insulation layer 500 to transfer the second graphical target pattern to the insulation layer 500. In this embodiment, a fluorine-containing etching is used to etch the insulation layer 500, fluorine-containing etching gases include one or more of octafluorocyclobutanne, octafluorocyclopentene, and hexafuorobutadiene. After the insulation layer 500 is etched, the second hard mask layer 800 is removed.

Figure 12:
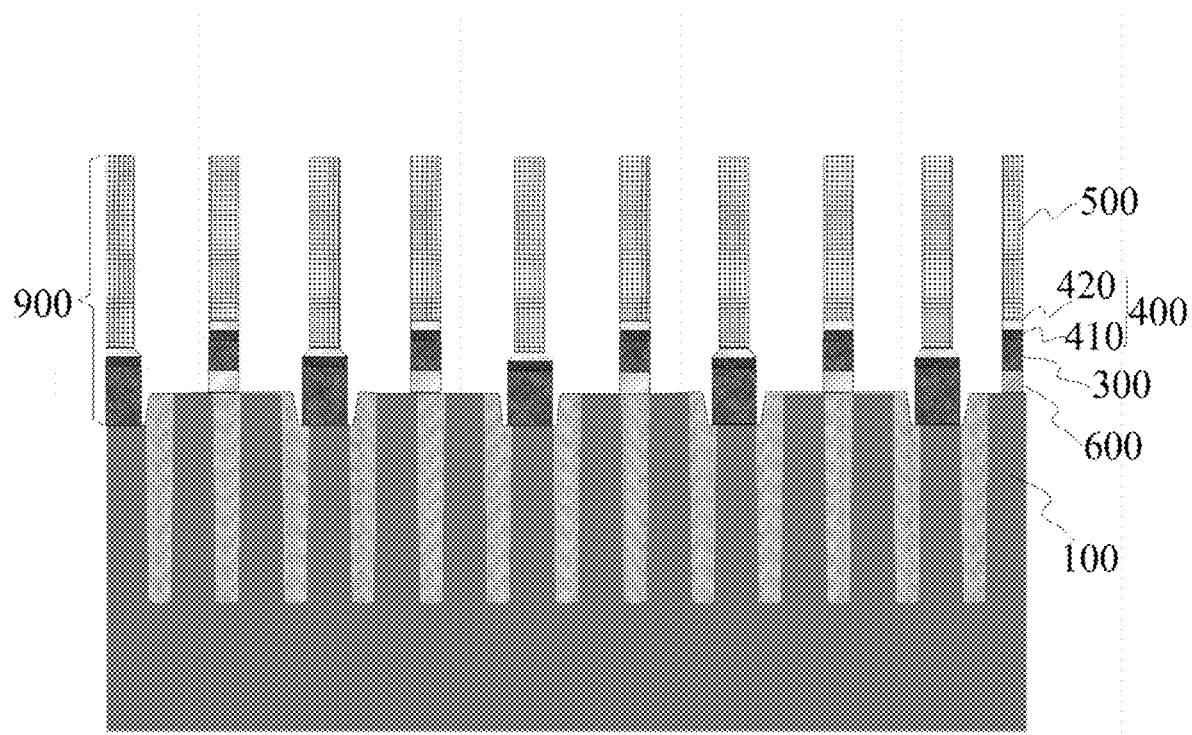

3) Referring to FIG. 12, with the insulation layer 500 serving as a mask, etching the metal conductive layer 400 and the non-metal conductive layer 300 to form the bitline structure 900. In this embodiment, the procedure of etching the metal conductive layer 400 and the non-metal conductive layer 300 is mainly as follows.

Firstly, with the metal barrier material layer 410 serving as an etching stop layer, the insulation layer 500 is used as a mask to etch the metal material layer 420 to transfer the second graphical target pattern to the metal material layer 420; in this embodiment, the metal material layer 420 is made of tungsten, and thus, an etching gas containing silicon hexafluoride may be used to etch the metal material layer 420 in this step.

Secondly, with the non-metal conductive layer 300 serving as an etching stop layer, the insulation layer 500 is used as the mask to etch the metal barrier material layer 410 to transfer the second graphical target pattern to the metal barrier material layer 410; in this embodiment, silicon nitride is used to manufacture the metal barrier material layer 410.

Then, the insulation layer 500 is used as the mask to etch the non-metal conductive layer 300 to transfer the second graphical target pattern to the non-metal conductive layer 300. In this embodiment, the polycrystalline silicon material is used to form the non-metal conductive layer 300, and chlorine is used to etch the non-metal conductive layer 300. Since it is easier for micromolecular chlorine to enter the bitline contact hole 200, the duration of etching the non-metal conductive layer 300 may be shortened, ensuring that the etched non-metal conductive layer 300 has a good shape and a large width. The non-metal conductive layer 300 is of a cross-section shape of trapezoid after being etched. The non-metal conductive layer 300 of this shape may provide a good support to the metal conductive layer and the insulation layer located above it, reducing a collapsing risk for the bitline structure 900.

An embodiment of the present application further provides a semiconductor structure formed using the manufacturing method according to any of the embodiments described above. With continued reference to FIG. 12, the semiconductor structure includes a substrate 100 and a bitline structure 900.

The substrate 100 has a plurality of bitline contact holes 200.

The bitline structure 900 includes a non-metal conductive layer 300, a metal conductive layer 400, and an insulation layer 500 disposed from bottom to top as a stack, wherein the non-metal conductive layer 300 is sequentially and alternately located on a surface of the semiconductor substrate 100 and a bottom of the bitline contact hole 200; wherein the metal conductive layer 400 and the non-metal conductive layer 300 collectively form a bitline, and the bitline located in the bitline contact hole has a width no less than the bitline located outside of the bitline contact hole.

It can be understood that in this embodiment, the semiconductor structure is manufactured by using the method according to the embodiments described above; with the formation of the non-metal conductive layer 300 having a first opening K1 and the formation of the metal conductive layer 400 having a second opening K2 during the manufacturing procedure, such that the duration of etching the metal conductive layer 400 located outside of the bitline contact hole 200 is increased in the course of forming the bitline structure 900 by the etching process, and the metal conductive layer 400 located outside of the bitline contact hole 200 has a width less than or equal to the bottom of the metal conductive layer 400 located in the bitline contact hole 200, which is beneficial to increase the area of the node contact window and the bitline structure 900 contacting the active region, reducing the node contact resistance and the bitline contact resistance, and improving the quality of the semiconductor structure.

In this embodiment, the substrate 100 includes a base and a shallow trench structure formed in the base. The shallow trench structure defines a plurality of active regions in a parallel staggered arrangement, and is filled with insulation material to form a shallow trench isolation structure. The substrate 100 also includes a wordline structure, which is an embedded wordline structure; an extending direction of the embedded wordline structure intersects with an extending direction of the bitline structure 900. In addition, the wordline structure may also be formed on the surface of the base.

In one of the embodiments, in the bitline structure 900, the bottom of the metal conductive layer 400 located in the bitline contact hole 200 has a width greater than the metal conductive layer 400 located outside of the bitline contact hole 200.

In this embodiment, the bottom of the metal conductive layer 400 located in the bitline contact hole 200 has a width of d1, the metal conductive layer 400 located outside of the bitline contact hole 200 has a width of d2, wherein d1>d2. In the case where the width of d1 has a greater value, a width of the non-metal conductive layer 300 located below is increased therewith; thus, an overall width of the bitline located in the bitline contact hole 200 is increased, and the contact area between the bitline and the active region is increased and thus, the contact resistance between them is decreased. Besides, by thinning the metal conductive layer 400 located outside of the bitline contact hole 200, the width of the non-metal conductive layer 300 located below is reduced, the contact area between the node contact window and the active region is increased, reducing the node contact resistance.

In one of the embodiments, the semiconductor structure further includes a dielectric layer 600 located between the surface of the substrate 100 and the non-metal conductive layer 300. In this embodiment, the wordline structure and the bitline structure is isolated by the dielectric layer 600.

Technical features of the embodiments described above may be arbitrarily combined, but not all of the potential combinations are described so as to make the description concise. However, all of the combinations of these technical features should be considered as the scope recited in the specification as long as they have no conflict therein.

The embodiments described above merely show several implementations of the present application. The descriptions thereof are detailed, but should not be interpreted as limiting the scope of the patent application. It should be noted that the person skilled in the art could further make several variations and improvements without departing the concept of the present application, and these variations and improvements belong to the scope sought for protection in the present application. Therefore, the protection scope of the present patent application shall be subject to the claims.

What is claimed is:

1. A method of manufacturing a semiconductor structure, comprising:
    providing a substrate;
    forming a bitline contact hole located in the substrate, and forming a non-metal conductive layer to cover a surface of the substrate and fill the bitline contact hole, the non-metal conductive layer having a first opening formed therein, the first opening aligned with the bitline contact hole;
    forming a metal conductive layer to cover a surface of the non-metal conductive layer;
    forming an insulation layer to cover a surface of the metal conductive layer; and
    etching the insulation layer, the metal conductive layer, and the non-metal conductive layer to form a bitline structure;
    wherein the metal conductive layer and the non-metal conductive layer collectively form a bitline, and the bitline located in the bitline contact hole has a width not less than that of the bitline located outside of the bitline contact hole;
    wherein forming the bitline contact hole and the non-metal conductive layer comprises:
    forming a first sublayer of non-metal conductive material on the substrate;
    etching the first sublayer of non-metal conductive material and the substrate to form the bitline contact hole, a retained first sublayer of non-metal conductive material serving as a first sublayer of the non-metal conductive layer; and
    forming a second sublayer of the non-metal conductive layer to cover the bitline contact hole, and a top of the second sublayer of the non-metal conductive layer is lower than a top of the first sublayer of the non-metal conductive layer, the first and second sublayers of the non-metal conductive layer collectively forming the non-metal conductive layer.

2. The method of manufacturing the semiconductor structure according to claim 1, wherein in the bitline structure, the bitline located in the bitline contact hole has a width greater than that of the bitline outside of the bitline contact hole.

3. The method of manufacturing the semiconductor structure according to claim 1, wherein etching the first sublayer of non-metal conductive material and the substrate to form the bitline contact hole comprises:
forming a first hard mask layer on the first sublayer of non-metal conductive material, the first hard mask layer having a first graphical target pattern, the first graphical target pattern defining the bitline contact hole; and
etching, based on the first hard mask layer, the first sublayer of non-metal conductive material and the substrate to form the bitline contact hole.

4. The method of manufacturing the semiconductor structure according to claim 3, wherein forming the second sublayer of the non-metal conductive layer comprises:
forming a second sublayer of non-metal conductive material to fill the bitline contact hole and to cover a surface of the first hard mask layer; and
etching the second sublayer of non-metal conductive material based on the first hard mask layer until a height difference between a top of the first sublayer of non-metal conductive material and a top of the second sublayer of non-metal conductive material equals to a preset value, a retained second sublayer of non-metal conductive material serving as the second sublayer of the non-metal conductive layer.

5. The method of manufacturing the semiconductor structure according to claim 1, wherein an atomic layer deposition technology is used to form the metal conductive layer.

6. The method of manufacturing the semiconductor structure according to claim 1, wherein forming the metal conductive layer comprises:
forming a metal barrier material layer to cover the surface of the non-metal conductive layer; and
forming a metal material layer to cover a surface of the metal barrier material layer.

7. The method of manufacturing the semiconductor structure according to claim 1, wherein etching the insulation layer, the metal conductive layer, and the non-metal conductive layer to form the bitline structure comprises:
forming a second hard mask layer on the insulation layer, the second hard mask layer having a second graphical target pattern, the second graphical target pattern defining the bitline structure;
with the metal conductive layer serving as an etching stop layer, using the second hard mask layer as a mask to etch the insulation layer to transfer the second graphical target pattern to the insulation layer;
removing the second hard mask layer; and
with the insulation layer serving as a mask, etching the metal conductive layer and the non-metal conductive layer to form the bitline structure.

8. The method of manufacturing the semiconductor structure according to claim 7, wherein using the insulation layer as the mask to etch the metal conductive layer and the non-metal conductive layer comprises:
with a metal barrier material layer serving as an etching stop layer, using the insulation layer as a mask to etch metal material to transfer the second graphical target pattern to the metal conductive layer;
with the non-metal conductive layer serving as an etching stop layer, using the insulation layer as the mask to etch the metal barrier material layer to transfer the second graphical target pattern to the metal barrier material layer; and
using the insulation layer as the mask to etch the non-metal conductive layer to transfer the second graphical target pattern to the non-metal conductive layer.

9. The method of manufacturing the semiconductor structure according to claim 1, wherein a polycrystalline material is used to manufacture a non-metal conductive material layer.

10. The method of manufacturing the semiconductor structure according to claim 9, wherein an etching gas containing Cl2 is used to etch the non-metal conductive layer.

11. The method of manufacturing the semiconductor structure according to claim 1, wherein the method further comprises:
before the bitline contact hole and the non-metal conductive layer are formed, forming a dielectric layer to cover the surface of the substrate.

* * * * *